United States Patent
Sengers et al.

(10) Patent No.: US 7,542,127 B2
(45) Date of Patent: Jun. 2, 2009

(54) LITHOGRAPHIC APPARATUS AND METHOD FOR MANUFACTURING A DEVICE

(75) Inventors: Timotheus Franciscus Sengers, 's-Hertogenbosch (NL); Nicolaas Antonius Allegondus Johannes Van Asten, Breda (NL); Wilhelmus Josephus Box, Eksel (BE); Tjarko Adriaan Rudolf Van Empel, Eindhoven (NL); Leon Martin Levasier, Hedel (NL); Erik Roelof Loopstra, Heeze (NL); Marcel Johannus Elisabeth Hubertus Muitjens, Nuth (NL); Luberthus Ouwehand, 's-Hertogenbosch (NL); Leon Joseph Marie Van Den Schoor, 's-Hertogenbosch (NL); Marcel Beckers, Eindhoven (NL); Rob Jansen, Veldhoven (NL); Elke Van Loenhout, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 147 days.

(21) Appl. No.: 11/312,660

(22) Filed: Dec. 21, 2005

(65) Prior Publication Data

US 2007/0139629 A1 Jun. 21, 2007

(51) Int. Cl.
*G03B 27/52* (2006.01)
*G03B 27/54* (2006.01)

(52) U.S. Cl. .............................. 355/30; 355/67; 355/71; 378/34

(58) Field of Classification Search .................... 355/30, 355/67, 71; 378/34, 35
See application file for complete search history.

(56) References Cited

U.S. PATENT DOCUMENTS

| | | | | |
|---|---|---|---|---|
| 4,786,947 | A | 11/1988 | Kosugi et al. | 355/30 |
| 5,715,064 | A * | 2/1998 | Lin | 356/401 |
| 6,731,371 | B1 * | 5/2004 | Shiraishi | 355/30 |

(Continued)

FOREIGN PATENT DOCUMENTS

EP 0 687 957 A1 12/1995

(Continued)

OTHER PUBLICATIONS

European Search Report issued for European Patent Application No. 06077157.3—1226, dated Apr. 18, 2007.

(Continued)

*Primary Examiner*—D. Rutledge
(74) *Attorney, Agent, or Firm*—Pillsbury Winthrop Shaw Pittman LLP (57) ABSTRACT

A lithographic apparatus is disclosed. The apparatus includes a substrate table constructed to hold a substrate. The substrate table is moveable to transfer the substrate between a substrate measuring position and a substrate processing position. The apparatus also includes a measuring system configured to measure at least one aspect or characteristic of the substrate when the substrate table holds the substrate in the measuring position. The measuring system is configured to direct at least one measuring beam and/or field towards a surface of the substrate. A projection system is configured to project a patterned radiation beam onto a target portion of the substrate when the substrate table holds the substrate in the substrate processing position, and a conditioning system is configured to supply a conditioning fluid to at least part of a path of the measuring beam and/or field of the measuring system to condition the part of the path.

29 Claims, 4 Drawing Sheets

U.S. PATENT DOCUMENTS

| | | | |
|---|---|---|---|
| 6,813,026 B2 * | 11/2004 | McAninch | 356/445 |
| 2001/0006422 A1 * | 7/2001 | Fukagawa et al. | 356/500 |
| 2004/0156026 A1 * | 8/2004 | Kamiya | 355/30 |
| 2004/0218158 A1 * | 11/2004 | Nishi | 355/30 |
| 2005/0271558 A1 * | 12/2005 | Hara et al. | 422/105 |
| 2006/0087631 A1 * | 4/2006 | Lallemant et al. | 355/53 |
| 2008/0174750 A1 * | 7/2008 | Dansberg et al. | 355/30 |

FOREIGN PATENT DOCUMENTS

| | | |
|---|---|---|
| EP | 1 717 845 A1 | 11/2006 |
| WO | WO 2005/081291 A1 | 9/2005 |
| WO | WO 2005/081293 A1 | 9/2005 |

OTHER PUBLICATIONS

Singaporean Written Opinion and Search Report for Application No. SG 200608858-7 dated Jun. 5, 2008.

* cited by examiner

LITHOGRAPHIC APPARATUS AND METHOD FOR MANUFACTURING A DEVICE

BACKGROUND

1. Field

The present invention relates to a lithographic apparatus and a method for manufacturing a device, and to a device manufactured thereby.

2. Description of Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known apparatus, a substrate can be held in a measuring position by a substrate table, to measure certain aspects of the substrate, for example to detect a position and/or orientation of the substrate. For example, the measuring or detecting of the substrate can be carried out remotely by one or more sensors, using one or more measuring beams. After the measuring of certain substrate aspects, the substrate table can be moved to transfer the substrate to a position where the substrate can be irradiated with a patterned radiation beam. Results of the measurement of one or more substrate aspects (for example: location and/or orientation of the substrate with respect to the substrate table) can be used, for example, to focus and/or direct the patterned radiation beam onto a desired part of the substrate, to position the substrate table with respect to the radiation beam, and/or in a different way.

SUMMARY

It is desirable to improve the apparatus, wherein the apparatus can manufacture devices, having small features, with high precision.

According to an embodiment of the invention, there is provided a lithographic apparatus that includes a substrate table constructed to hold a substrate. The substrate table is moveable to transfer the substrate between a substrate measuring position and a substrate processing position. A measuring system is configured to measure at least one aspect and/or characteristic of the substrate when the substrate table holds the substrate in the measuring position. The measuring system is configured to direct at least one measuring beam and/or field towards a surface of the substrate. A projection system is configured to project a patterned radiation beam onto a target portion of the substrate when the substrate table holds the substrate in the substrate processing position. A conditioning system is configured to supply a conditioning fluid to at least part of a path of the measuring beam and/or field of the measuring system to condition the part of the path.

According to an embodiment of the invention, there is provided a lithographic projection apparatus that includes a substrate table constructed to hold a substrate. The substrate table is moveable to transfer the substrate between a substrate measuring position and a substrate processing position. A measuring system is configured to measure at least one aspect and/or characteristic of the substrate when the substrate table holds the substrate in the measuring position. The measuring system is configured to direct at least one measuring beam and/or field towards a surface of the substrate. A projection system is configured to project a patterned radiation beam onto a target portion of the substrate when the substrate table holds the substrate in the substrate processing position. The apparatus also includes a space filling and/or space enclosing body that includes a fluid flow control surface that extends opposite the substrate measuring position and near the measuring position. The fluid flow control surface extends substantially parallel to the substrate surface of a substrate held in the substrate measuring position. The space filling and/or space enclosing body is configured to direct a conditioning fluid to at least the part of the path of the measuring beam and/or field of the measuring system. The path part extends between the fluid flow control surface and a substrate surface.

According to an embodiment of the invention, there is provided a device manufacturing method comprising: holding a substrate in a measuring position, detecting at least one aspect, characteristic, position and/or orientation of the substrate being held in the measuring position with at least one measuring beam and/or field that is emitted towards a surface of the substrate. The method also includes directing a conditioning fluid to at least part of a path of the measuring beam and/or field to condition the part of the path, and moving the substrate table to transfer the substrate from the measuring position to a processing position after the detecting of at least one aspect, characteristic, position and/or orientation of the substrate.

Also, an embodiment of the invention provides a lithographic apparatus that includes a substrate table constructed to hold a substrate. The substrate table is moveable to transfer the substrate between a substrate measuring position and a substrate processing position. A measuring system is configured to measure at least one aspect and/or characteristic of the substrate when the substrate table holds the substrate in the measuring position. The measuring system is configured to emit at least one measuring beam and/or field towards a surface of the substrate. A projection system is configured to project a patterned radiation beam onto a target portion of the substrate when the substrate table holds the substrate in the substrate processing position. The apparatus also includes a space filling and/or space enclosing body that includes a fluid flow control surface that extends opposite the substrate measuring position and near the measuring position. The apparatus further includes a system to thermally condition the space filling and/or enclosing body.

Also, an embodiment of the invention provides a device manufactured using an apparatus or a method according to an embodiment of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
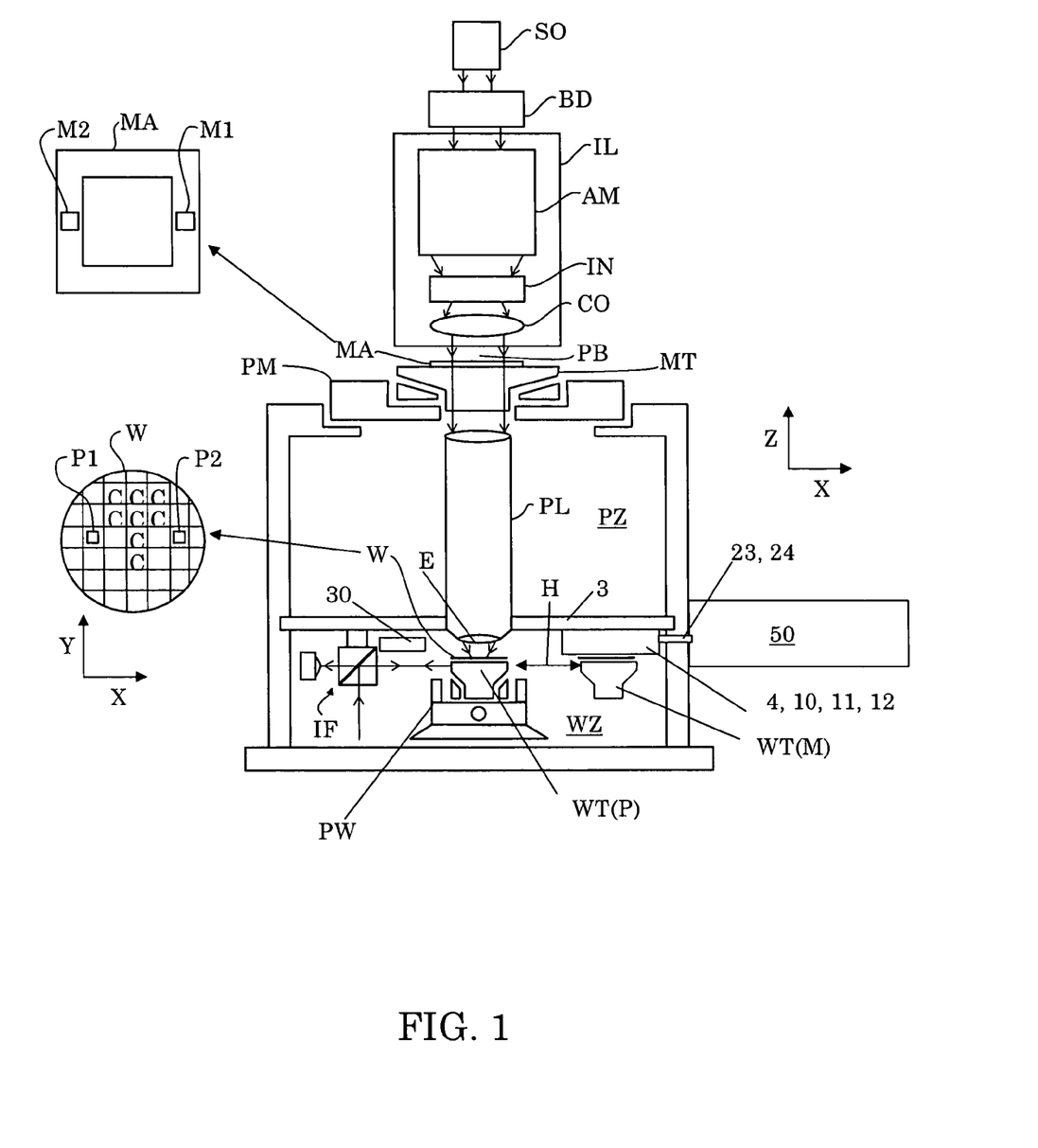
FIG. 1 schematically depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam PB (e.g. UV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device IF, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an embodiment, shown in FIG. 1, the substrate table WT is moveable, to transfer the substrate W, held by the table WT, at least from a substrate measuring position to a substrate processing position. In FIG. 1, a substrate table position to hold the substrate W in the processing position is indicated by WT(P). A substrate table position to hold the substrate W in the measuring position is indicated by WT(M). As an example, the measuring position can be located away from a downstream end E of the projection system, whereas the processing position can be located near and/or opposite that downstream end E of the projection system.

When the substrate table WT holds the substrate W in the processing position, designated by WT(P), the substrate W can be illuminated by the projection system. Particularly, the substrate can not be exposed by the projection system when the substrate is in the measuring position, designated by WT(M). Preferably, during the moving of the substrate table from a respective substrate measuring zone to a respective substrate projection zone, the substrate W remains in the same position on the substrate table WT.

For example, the measuring position and the processing position of the substrate can be located in the same interior part or chamber of the apparatus, for example, in a substrate zone WZ of the apparatus. As an example, an intermediate frame part 3 (for example a metrology frame part) of the apparatus can substantially separate this interior apparatus zone WZ from one or more other apparatus zones, such as from a projection system zone PZ. Alternatively, the measuring position and the processing position of the substrate can be located in different zones, for example in case the measuring position is located outside the apparatus.

The movement of the substrate table WT between desired substrate table positions WT(M), and WT(P) can be carried out by various means, as will be clear to the skilled person. For example, at least part of such a movement can be provided with the aid of the second positioner PW, a substrate table conveyor and/or by one or more other transport mechanisms. In a further embodiment, the substrate WT is movable from the substrate measuring position to the substrate processing position substantially in a single virtual plane or level. As a non-limiting example, in FIG. 1, the substrate table WT can be movable in a substantially horizontal direction H, or the XY-plane, to move the substrate W in a substantially horizontal direction or along the XY-plane from the measuring position to the processing position, or vice versa.

In an embodiment, the apparatus can be provided with a measuring system 10, 11, 12 configured or capable to measure at least one aspect and/or characteristic of the substrate when the substrate table WT holds the substrate W in the measuring position. Such a measuring system, which has been schematically depicted in the Figures, can be constructed in various ways. In a further embodiment, the measuring system 10, 11, 12 can be configured to use one or more measuring beams and/or fields to measure or monitor the substrate. For example, in a further embodiment, the measuring system 10, 11, 12 can be capable to direct or emit one or more measuring light beams 8, 9 towards the surface of the substrate W. For example, in that case, the measuring system can also be configured to detect at one or more parts of the light beam(s) 8, 9 which are reflected by the substrate surface.

It should be noted that the term "measuring beam and/or field" in the present application has to be construed broadly. The term "measuring beam" can include an electromagnetic beam, an electrical beam, an optical beam, a particle beam, an acoustic beam, and/or a different type of measuring beam. A measuring field can be, for example, an electromagnetic field, or a different field suitable to measure one or more aspects of the substrate.

For example, the measuring system can be configured to measure at least one aspect and/or characteristic of the substrate, using for example an electromagnetic, acoustic, electrical and/or a capacitive measuring method, or a different type of measuring method. Similarly, the term "direct or emit" a measuring beam and/or field should be construed broadly, in line with the broad interpretation of the term "measuring beam and/or field" above. For example, the measuring system can comprise a capacitive levelling system, and/or an acoustic substrate height detection system.

In a further embodiment, each of the measuring beams 8, 9 can be a light beam. Herein, the term "light beam" should be interpreted broadly. The measuring (light) beam can be a suitable radiation beam, that can be at least partly reflected by the surface of a substrate W to be measured. For example, the measuring beam can include an optical beam of radiation of one or more wavelengths in the visible range, an/or a light beam having one or more different wavelengths of radiation.

For example, the measuring system can be configured to measure a position and/or orientation of the substrate W with respect to the substrate holder (or table) WT. Such a position and/or orientation of the substrate W can include a certain alignment or misalignment of the substrate with respect to the substrate table, one or more substrate positions measured in directions parallel to the substrate's surface, a certain tilt of the substrate, a certain rotational substrate position, a level, thickness and/or of height position of the substrate—measured perpendicularly with respect to the substrate surface—, and/or other substrate positions and/or orientations. For example, the measuring system can be configured to provide data, which can be used to detect the position of the substrate with respect to the substrate table in 6 different degrees of freedom. Also, the measuring system can be configured to detect the position of the substrate table WT when the table WT holds a substrate W in the measuring position. Besides, the measuring system can be provided with (predetermined) information concerning a precise position of the substrate table WT, when the table holds the substrate in the measuring position. The apparatus can comprise control means, which can control the measuring system, and can use measuring results to calculate or estimate certain aspects of the substrate. Such control means are not depicted; to the skilled person, it will be clear how such control means can be configured.

Figure 2:
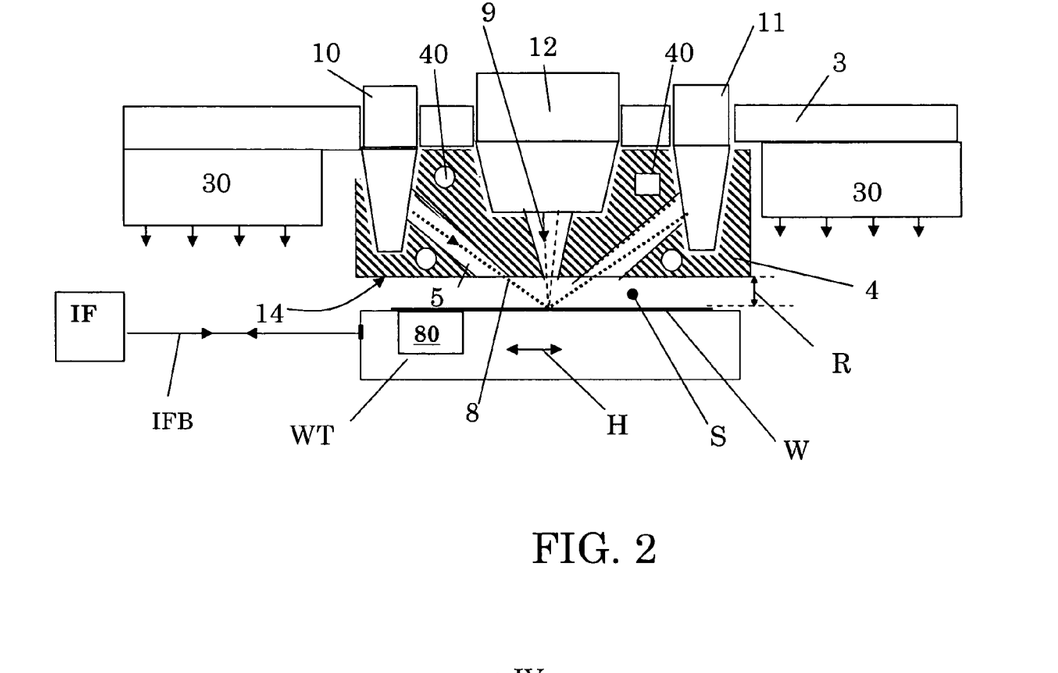
FIG. 2 schematically depicts a cross-section of part of the apparatus shown in FIG. 1.
Figure 3:
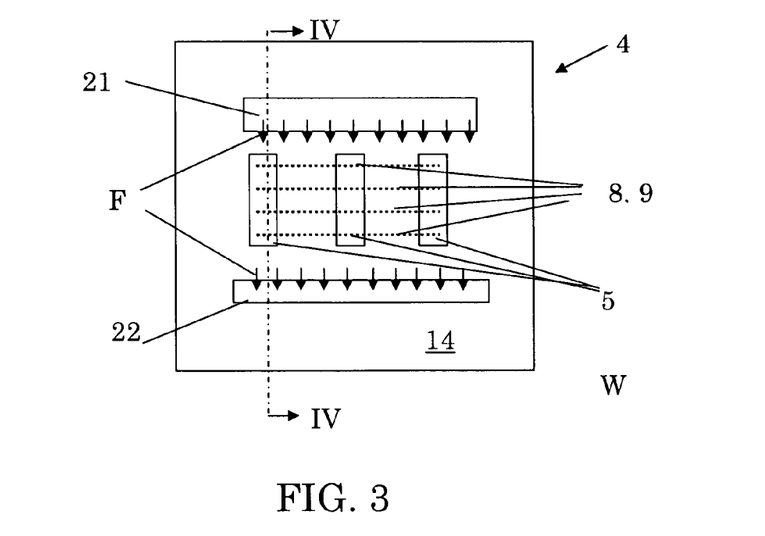
FIG. 3 schematically depicts a bottom view of a space filling and/or enclosing body of the apparatus shown in FIGS. 1 and 2.

In an embodiment, the measuring system can be provided with one or more alignment sensors 12 to detect certain alignment markers which can be provided on a substrate W, for detecting the position of the substrate in a certain plane (such as the XY plane in FIG. 1). In FIG. 2, an embodiment of an alignment sensor 12 is schematically depicted. The alignment sensor 12 can be configured to emit one or more alignment measuring beams 9 towards the surface of the substrate W, held in the measuring position, and to detect reflected parts of the alignment measuring beams 9.

Also, for example, the measuring system can be provided with one or more level sensors 10, 11, configured to detect a certain levelling of a substrate W held in the measuring position. In the embodiment of FIG. 2, the level sensors comprise a number of level measuring beam emitters 10, configured to emit a plurality of substantially parallel level measuring beams 8, and one or more level measuring beam detectors 11 to detect reflected parts of the level measuring beams 8. As is shown in FIG. 2, the alignment measuring beam(s) 9 and the level measuring beam(s) 8 can be directed towards substantially the same part of the substrate surface by the respective sensors 10, 11, 12. Alternatively, various measuring beams 8, 9 can be directed towards different substrate parts. Besides, as is shown in FIG. 2, an angle of incidence of a mentioned level measuring beam can be significantly larger (closer to 90°) than an angle of incidence of a mentioned alignment measuring beam (the angles of incidence being measured with respect to a normal of the substrate surface).

The measuring system can also be provided with one or more other sensors, for example with one or more planar encoders (not depicted). Also, in case the measuring system is configured to use one or more measuring fields, the measuring system can comprise one or more suitable field generators, for example one or more electromagnetic field generators in case the measuring field is an electromagnetic field, as will be clear to the skilled person.

The measuring system 10, 11, 12 can provide a remote sensing means, to detect the position and/or orientation of the substrate W prior to the substrate being illuminated by the projection system. Particularly, results of the measurement of the location and/or orientation of the substrate with respect to the substrate table can be used to focus and/or direct a patterned radiation beam onto a desired part of the substrate, to position the substrate table with respect to the patterned radiation beam, or in a different way. In a further embodiment, the substrate W is not being repositioned with respect to the substrate table WT during a period which runs from the measuring system 10, 11, 12 measuring or detecting the substrate's position/orientation to the projection system having projected the radiation beam onto the substrate W. In that case, the measurement results of the present measurement system are not used to (re)align the substrate W with respect to the substrate table WT as such.

Alternatively, the measurement results of the measurement system are used to (re)align the substrate W with respect to the substrate table, before the patterned radiation beam is projected onto the substrate W.

In an embodiment, the apparatus also comprises a conditioning system 4, 50 configured to condition at least part of a path of the measuring beams and/or field(s) of the measuring system. An embodiment of such a conditioning system 4 is schematically depicted in FIGS. 1-5.

In the embodiment of FIGS. 1-5, the conditioning system comprises a space filling and/or space enclosing body 4, having a fluid flow control surface 14. The fluid flow control surface 14 extends opposite the substrate measuring position (see FIG. 2). The fluid flow control surface 14 is arranged to provide or enclose a relatively narrow slit S with at least the substrate surface part of a substrate W held in the substrate measuring position, which substrate surface part is faced away from the substrate table WT and receives the measuring beams 8, 9 of the measuring system during use. In the present embodiment, the fluid flow control surface 14 extends substantially parallel to the substrate surface of the substrate W held in the substrate measuring position. In a further embodiment, the fluid flow control surface 14 can extend opposite the whole surface of a substrate, located in the measuring position, and optionally opposite at least a surface part of an opposite substrate table WT. In this way, a relatively long, narrow, slit S can be provided between the substrate surface and the space filling and/or space enclosing body 4.

The fluid flow control surface 14 as such can be arranged and configured in various ways. For example, this surface can be a substantially flat, substantially continuous or uninterrupted surface, except where specifically indicated otherwise (such as concerning the application of light apertures for emitting and receiving measuring beams and/or the application of fluid outlets and/or inlets to supply and/or remove or extract conditioning fluid). Alternatively, the fluid flow control surface 14 may be profiled, include small fluid guiding grooves and/or comprise a certain relief, for example to direct fluid along that surface 14 towards a desired direction.

The space filling and/or space enclosing body 4 as such can provide a passive means or barrier, to prevent ambient fluid to reach the paths of the measuring beams 8, 9, or to reduce the chance that ambient fluid can reach those paths. Particularly, such ambient fluid can be fluid, for example gas or air, which can be generally present in a mentioned substrate zone WZ of the apparatus. For example, such ambient fluid can include gas originating from one or more gas showers 30, which gas showers 30 can be configured to direct gas to certain other areas of the apparatus than to the area of the substrate measuring position. As an example, such one or more gas showers 30 can be provided to condition one or more interferometer beams IFB of a mentioned interferometer device IF (see FIGS. 1 and 2). Besides, such ambient fluid can include a gas or gas mixture which can be dragged or sucked in a wake behind the substrate table WT, which wake may be induced by certain swift movements (for example with a speed of one or more m/s) of the substrate table WT.

The space filling and/or space enclosing body 4 can be constructed in various ways, and of various materials. For example, this body 4 can be a substantially solid body, structure, plate and/or element, or this body 4 can be an at least partly hollow body, structure, plate and/or element. Also, the space filling and/or space enclosing body 4 can have a substantially fluid tight, or sealed, outer surface, except where specifically indicated otherwise. In an embodiment, the space filling and/or space enclosing body 4 is mounted to an intermediate frame part 3 of the apparatus, which frame part separates an interior zone, for example the substrate zone WZ, from an other interior zone of the apparatus. For example, the space filling and/or space enclosing body 4 can be integrally connected or fixed to a frame part 3 of the apparatus, or be made in one piece with such an apparatus part 3. The space filling and/or space enclosing body 4 can be made of one or more metals, plastics, alloys and/or a combination of these or other materials.

In an embodiment, during use, the closest distance R (see FIG. 2) between the fluid flow control surface 14 of the body 4 and the substrate surface, or the width R of the slit S between the fluid flow control surface 14 and the substrate surface, is less than about 5 mm. For example, the closest distance R between the fluid flow control surface 14 and the substrate surface, or the slit width R, can be in the range of about 1-2 mm. Alternatively, the mentioned closest distance, or slit width R, can be smaller than about 1 mm, or smaller than about 10 mm, or larger than about 5 mm.

The space filling and/or space enclosing body 4 can be provided with one or more of the mentioned sensors 10, 11, 12 and/or field generators of the measuring system, as is depicted in FIG. 2. Besides, for example, in the present embodiment, the space filling and/or space enclosing body 4 can comprise one or more measuring beam passages and/or measuring beam conductors, particularly light passages and/or light conductors 5, to transmit the at least one measuring beam of the measuring system through at least part of that body 4, between the sensors 10, 11, 12 and the flow control surface 14. Alternatively, for example, in case the measuring beam is not an optical beam but for example an acoustical beam or a capacitive measuring beam, the conductor can include an acoustical or capacitive measurement volume to transmit the at least one measuring beam through at least part of that body and the flow control surface 14. To the skilled person it will be clear how the measuring beam passages and/or measuring beam conductors can be configured in view of a respective measuring beam.

Preferably, in the present embodiment, the at least one light passage and/or light conductor 5 provides a stationary light transmission medium. For example each light passage and/or light conductor 5 can be a solid light conductor, for example comprising glass or a transparent plastic. Alternatively, a light passage and/or light conductor 5 can be a hollow channel, filled with one or more transparent fluids, liquids, gasses or mixtures thereof, which channel can be closed off at or near the flow control surface 14 by a transparent covering.

In the present embodiment, the conditioning system 4, 50 is also configured to provide an active conditioning, by supplying a conditioning fluid F to at least parts of the paths of the light beams of the measuring system to condition that path parts, and particularly to thermally, optically, condition that path parts. For example, the conditioning fluid F can be a controlled gas or a gas mixture, for example ultra clean air, one or more inert gasses, or a different fluid, for example a liquid. Also, in a further embodiment, the conditioning system can be configured to provide a thermally conditioned conditioning fluid F, particularly when the system is configured to thermally condition that fluid. As an example, the conditioning system can comprise a heating and/or cooling system to heat and/or cool the conditioning fluid F, one or more temperature sensors to measure the temperature of the conditioning fluid F, and a control system to control a heating and/or cooling system to heat and/or cool conditioning fluid F to a desired and/or predetermined stable conditioning temperature. Also, the conditioning system can include one or more fluid lines 23, 24 and fluid pumps to pump conditioning fluid F to desired locations and/or to remove or extract conditioning fluid F from such locations. A part of the fluid conditioning system which can include a mentioned heating and/or cooling system, control system, temperature sensor and pumps is schematically indicated by a system part 50 in FIG. 1. To the skilled person, it will be clear how such conditioning system parts as such can be configured and arranged.

In the present embodiment, the conditioning system 4, 50 can be configured to direct the conditioning fluid F substantially towards at least part of a path of the light beams 8, 9 of the measuring system to optically condition that path part. Also, the conditioning system can be configured to direct the conditioning fluid F at least substantially towards and/or along the part of a surface of a substrate W being held in the measuring position, which surface part receives the at least one light beam 8, 9 of the measuring system during use. Thus, a well controlled thermal conditioning of the paths of the measuring beams can be achieved, resulting in accurate measuring results of the measuring system, which results can be used by the apparatus to manufacture devices having small features, with high precision.

In an embodiment, the conditioning system 4, 50 can be configured to condition at least one path part of the at least one light beam 8, 9 of the measuring system, which path part extends between the fluid flow control surface 14 and the substrate surface during use. For example, in the present embodiment, during use, when the measuring beams 8, 9 are being directed into the substrate surface, no conditioning fluid F has to be supplied into mentioned light passages and/or light conductors 5 of the space filling and/or space enclosing body 4, since these each light passage and/or light conductor 5 as such can provide a stationary light transmission medium.

Figure 4:
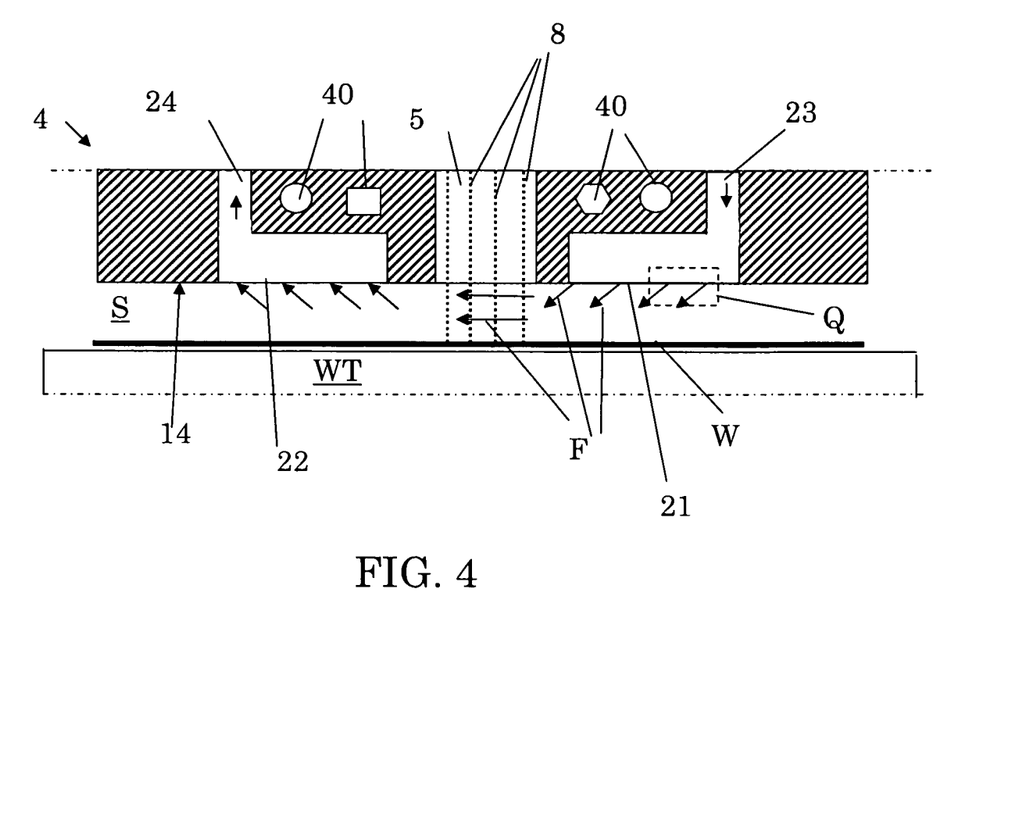
FIG. 4 schematically depicts a cross-section over line IV-IV of FIG. 3.

In the present embodiment, the conditioning system comprises at least one fluid outlet 21 to supply conditioning fluid F to the slit S extending between the fluid control surface 14 and the substrate surface during use. Also, the conditioning system comprises at least one fluid inlet 22 to remove or extract conditioning fluid F from the slit S. The fluid outlet 21 and fluid inlet 22 can be arranged at various locations. In the present embodiment, the at least one fluid outlet 21 and the at least one fluid inlet 22 are provided in, or as part of, the fluid control surface 14. The outlet 21 and inlet 22 can be located at substantially opposite sides with respect to parts of the path of the light beams 8, 9 of the measuring system (see FIGS. 3 and 4), to supply conditioning fluid F to that path parts and to remove/extract conditioning fluid F from that path parts. The outlet 21 and inlet 22 can also be arranged at different locations with respect to each other and with respect to the light beams 8, 9. Besides, the conditioning system can comprise one or more fluid supply lines 23 to supply conditioning fluid F to the fluid outlet(s) 21, and one or more fluid suction lines 24 to remove fluid from the fluid inlet(s) 22. At least parts of such supply and suction lines 23, 24 can extend through the space filling and/or space enclosing body 4, as is depicted in FIG. 4. Besides, for example, the conditioning fluid outlet(s) 21 can be part of a gas shower and/or purge hood.

Figure 5:
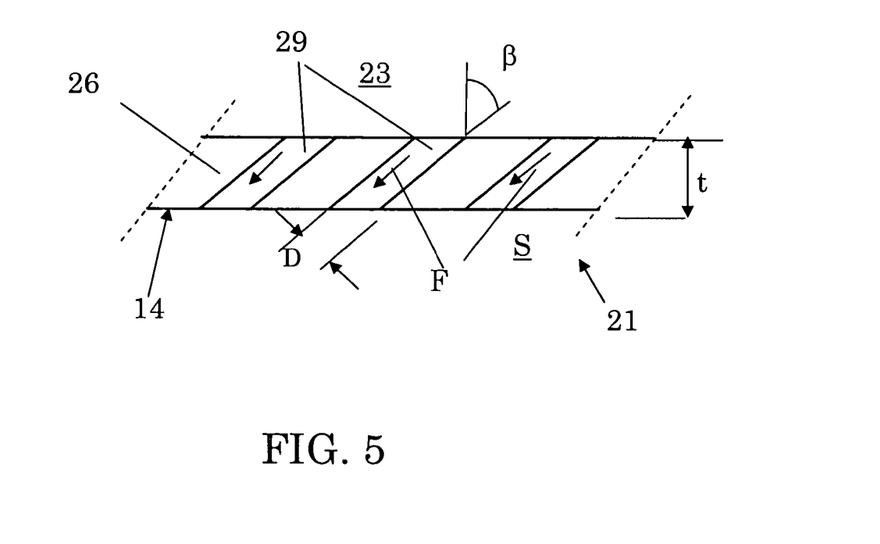
FIG. 5 depicts detail Q of FIG. 4.

Each fluid outlet 21 and fluid inlet 22 can be configured in various ways. For example, the outlet 21 and inlet 22 can include a porous material, a suitable gas disperser, mono filament cloth or fabric, one or more sheets having gas apertures, or a different fluid distributor. FIG. 5 depicts part of an embodiment of a fluid outlet 21, in cross-section. The fluid outlet 21 can comprise a plurality of inclined fluid passages 29 to supply fluid from an upstream fluid supply line or supply chamber 23 to the adjoining, mentioned, slit S. In a further embodiment, the fluid outlet 21 can be is provided by a thin sheet 26 having said plurality of inclined passages 29. Each of the passages can extend substantially obliquely through the sheet 26, see FIG. 5. In an embodiment of the invention, a thickness t of said sheet 26 (measured in a Z direction in the present Figures) can be smaller than about 1 mm. For example, said thickness t can be about 0.5 mm or smaller. Also, said sheet can be a metal sheet or an alloy sheet, for example stainless steel. In that case, relatively small fluid passages 29 can be manufactured with high accuracy using laser drilling. Fluid passages 29 can also be manufactured using different techniques. Also, the sheet 26 can be made of plastic, of one or more different materials. Besides laser drilling, different manufacturing methods can be applied to provide said passages 29, such as etching the passages, manufacturing the passages by electric discharge machining, and/or using different processes like deposition of metal on a mask. The sheet 26 can also be called a "micro sieve". The sheet 26 can include one or more layers of one or more materials. The sheet 26 can be, or provide, a wall or wall part of the space filling and/or space enclosing body 4. The fluid passages 29 of the sheet 26 can extend in various directions. For example, the passages 29 can enclose angles β with said fluid control surface 14, the angles being in the range of about 0°-60°. As an example, said angles can be in the range of about 20°-50°, or about 20°-40°. Besides, in an embodiment, a plurality of said fluid passages 29 extends substantially parallel with respect to each other. In this way, fluid can be directed by the fluid passages in substantially the same direction. Preferably, the fluid passages 29 are arranged to direct the conditioning fluid F towards the paths of the measuring beams 8, 9. Besides, in the present embodiment, each fluid passage 29 extends in a substantially straight direction through the sheet 26. Alternatively, fluid passages can be curved, or extend in other directions. The fluid passages 29 can have various diameters or dimensions. A diameter or width D of each of said passages can be, for example, smaller than about 0.2 mm. For example, said diameter or width can be smaller than about 0.1 mm. Good results are obtained when said diameter or width of each of said passages is about 0.08 mm, and the conditioning fluid is a gas or gas mixture.

In a further embodiment, the space filling and/or enclosing body 4 comprises a system to thermally condition that body. For example, as has been depicted in FIGS. 2 and 4, to this aim, the space filling and/or enclosing body 4 can comprise a number of fluid passages 40 to feed a second thermally conditioned fluid through that body 4. Such a second thermally conditioned fluid can be a gas or gas mixture, or a liquid, for example water, or a different fluid. The mentioned fluid passages 40 can be shaped and configured in various was, and can extend in various directions along and/or through the space filling and/or enclosing body 4, as follows from FIGS. 2 and 4. Also, the second thermally conditioned fluid can be the same as the conditioning fluid F used to optically condition parts of the paths of the measuring beams, or it can be a different fluid.

The apparatus can be provided with a system to thermally condition the space filling and/or enclosing body 4 in combination with or without the mentioned conditioning system configured to supply a conditioning fluid to at least part of a path of the measuring beam of the measuring system to optically condition that path part.

For example, in case the apparatus is only provided with a system to thermally condition the space filling and/or enclosing body 4, and not with or the conditioning system to supply a conditioning fluid to at least part of a path of the measuring beam of the measuring system, the space filling and/or enclosing body 4 can still provide a relatively good thermally conditioning of its environment, for example nearby paths of measuring beams. This can be particularly advantageous in case the substrate table is moving during use, which may cause a flow of gas or air through the paths of the measuring beams, above the substrate. In that case, such a flow of gas or air can be simply and effectively thermally conditioned by the thermally conditioned space filling and/or enclosing body, for example via heat conduction, radiation and/or convection, leading to a more uniform temperature of the paths of the measuring beams.

In a further embodiment, the apparatus is configured to detect a temperature of a substrate W. As an example, the space filling and/or enclosing body 4 and/or the substrate table WT can include a substrate temperature detector or monitor 80 (one such detector 80 is schematically depicted in FIG. 2). The apparatus can be configured to provide a conditioning fluid F with a conditioning temperature that is related to the detected substrate temperature. For example, the conditioning fluid F can be used to thermally condition the substrate W, when the substrate is held in the measuring position, or to keep the substrate at a predetermined substrate temperature. As an example, the apparatus can be configured to provide a conditioning fluid F with a conditioning temperature that is the same as the detected substrate temperature.

Also, in a further embodiment, the apparatus can be configured to detect a temperature of a substrate W, and to thermally condition the space filling and/or enclosing body 4 to a temperature is related to the detected substrate temperature. For example, the space filling and/or enclosing body 4 can be brought to and/or maintained at a temperature that is the same as the detected substrate temperature.

During use of the embodiment of FIGS. 1-5, the apparatus can carry out a device manufacturing method comprising: holding a substrate W in the measuring position, utilizing the substrate table WT; detecting at least one aspect, characteristic, position and/or orientation of the substrate W being held in the measuring position, wherein the measuring beams 8, 9 are emitted towards the surface of the substrate W and wherein measuring beam parts which are reflected by the surface of the substrate W, are being detected; directing the conditioning fluid F to at least part of the paths of the measuring beams 8, 9, extending through the slit S, to optically condition that path part; and moving the substrate table WT to transfer the substrate W to the processing position, after the detection of at least one aspect, characteristic, position and/or orientation of the substrate.

For example, during the measuring of the substrate W, the substrate W can be moved with respect to the measuring system, for example to scan the measuring beams 8, 9 over the substrate's surface.

At least during the measuring of certain substrate aspects and/or characteristics, as mentioned above, preferable, the space filling and/or enclosing body 4 is being thermally conditioned as such, for example by feeding a thermally conditioned fluid through fluid passages 40 of that body, and/or in a different manner. In this way, possibly thermally induced changes in volume and/or dimensions of the space filling and/or enclosing body 4 can be counteracted. Also, the thermally conditioned space filling and/or enclosing body 4 can provide a certain temperature conditioning of the nearby measuring area, for example heat exchange by convention and/or radiation.

The narrow slit S, extending between the space filling and/or enclosing body 4 and the wafer surface, can be thermally conditioned well, using the present method. Firstly, the space filling and/or enclosing body 4 as such can prevent, or reduce the chance, that less conditioned or mixed substrate zone WZ fluid can reach the measuring beams 8, 9. Besides, a thermally conditioned space filling and/or enclosing body 4 can thermally condition the adjoining slit S. Moreover, the conditioning fluid F, which can purge at least part of the slit S, can provide a direct and active thermal conditioning of the respective slit part. Thus, thermal fluctuations, which can result in undesired optical path length variations of the measuring beams 8, 9, can be reduced or prevented. This holds both for beam paths, running through the slit S, as for beam parts which extend through the space filling and/or enclosing body 4 (via the respective passages and/or conductors 5).

After the wafer measuring process, the substrate can be transferred to the processing position, and the patterned beam of radiation, being patterned by a patterning device MA, can be projected onto the substrate. Herein, the results of the detection of at least one aspect, characteristic, position and/or orientation of the substrate can be used to accurately project the patterned beam of radiation onto the substrate.

Also, in a further embodiment, the results of the detection of at least one aspect, characteristic, position and/or orientation of the substrate can be used to align the substrate with respect to a projection system, to project the patterned beam of radiation onto the substrate. Besides, in a further embodiment, the results of the detection or measurement of the position and/or orientation of the substrate can be used to align the substrate with respect to a mentioned support structure MT constructed to support a patterning device MA, or with respect to the patterning device MA.

In this way, measuring errors of the measuring system can be reduced, and devices can be made with high precision. As is mentioned above, in a further embodiment, the substrate W does not have to be repositioned with respect to the substrate table WT during the period which runs from the measuring system measuring or detecting the substrate's position/orientation to the projection system having projected the radiation beam onto the substrate W.

Figure 6:
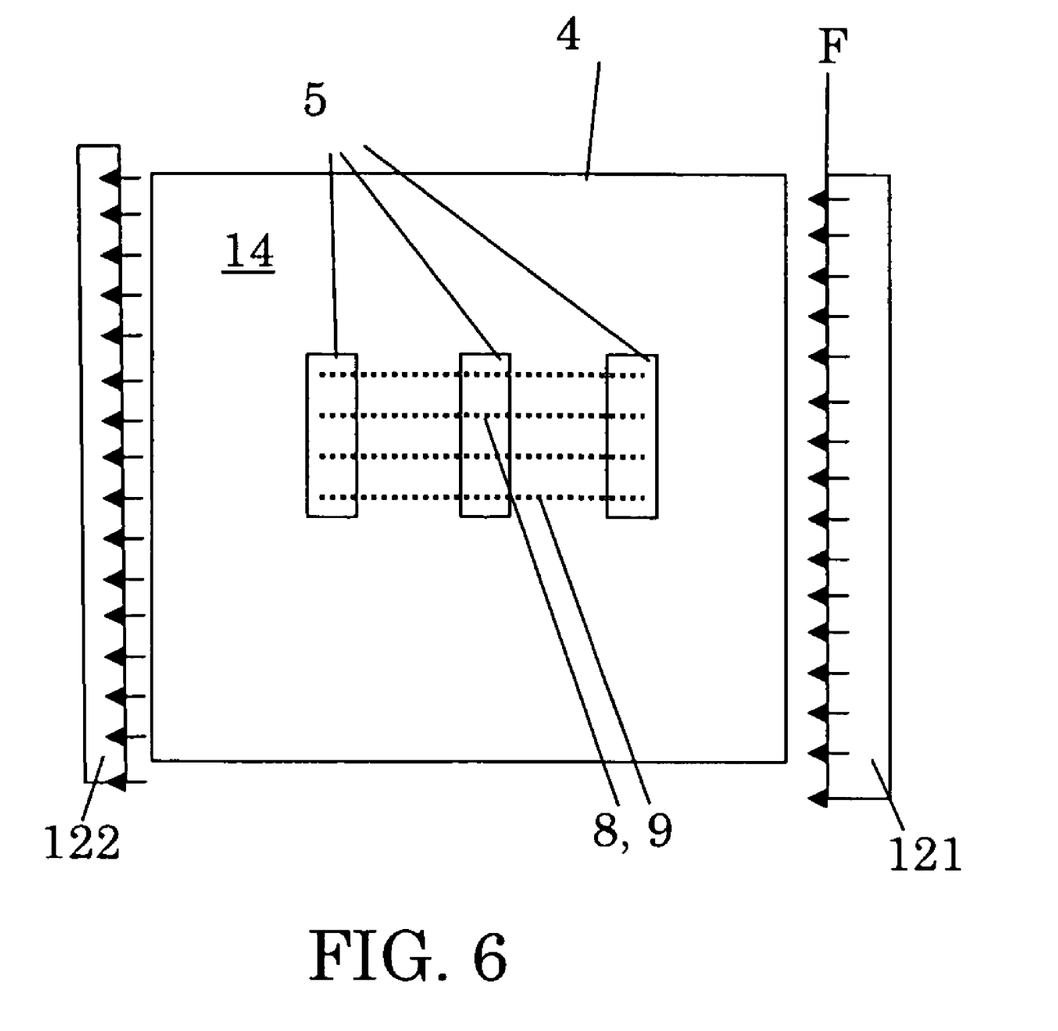
FIG. 6 is a view similar to FIG. 3 of an alternative embodiment.

FIG. 6 depicts an alternative embodiment of the apparatus, which differs from the embodiment shown in FIGS. 2-5, in that the fluid outlet 121 and fluid inlet 122 are not part of the fluid control surface 14. For example, in the embodiment of FIG. 6, the fluid outlet 121 and fluid inlet 122 are located close to opposite ends of the slit S provided between that fluid control surface 14 and a substrate surface (not visible in FIG. 6) to direct conditioning fluid F into and through that slit S, to condition parts of the measuring beam paths extending through the slit S. In the embodiment of FIG. 6, the conditioning fluid F can be directed substantially parallel to virtual planes, along which the measuring beams 8, 9 are being emitted. The operation of the embodiment of FIG. 6 is substantially the same as the functioning described above concerning the embodiment of FIGS. 1-5; however, in the embodiment of FIG. 6, a larger part of the slit S extending between the fluid control surface 14 and a substrate surface can be actively conditioned by the conditioning fluid F.

The present apparatus and method can improve reproducibility of the measuring system, for example of level sensors, alignment sensor and/or other sensors thereof. The apparatus and method can provide for a relatively optically constant medium/media through which the various light beams of these sensors travel, particularly constant in temperature and pressure. Thus, variations in the density, and consequently the refractive index, can be avoided. Besides, as an example, in case the measuring systems utilizes one or more fields, for example in case the system comprises a capacitive measuring system, variations of the dielectric constant of one or more media through which a respective measuring field passes, can be avoided or reduced. Also, in case an acoustic measuring system is implemented, variations of a sound speed in one or more media through which a respective acoustic measuring beam or signal traverses, can be avoided or reduced.

For example, the space filling and/or enclosing body 4 can at least partially fill up a gap in the apparatus, for example above the substrate measuring position. As follows from the above, for example, the space filling and/or enclosing body 4 can be mounted to a metrology frame 3 from below, and the body can have windows for transmission of the measuring beams 8, 9. In a further embodiment, the space filling and/or enclosing body 4 can comprise one or more mirrors for reference beams of an interferometer system. In a further embodiment, the space filling and/or enclosing body 4 can be called a 'flow plate', for example in case a bottom 14 of that body includes a flat plate that is parallel to the substrate W during use. A merit of the space filling and/or enclosing body 4 is that the body can replace large part of—for example—air near the substrate measuring position. The body 4 can therefore prevent or reduce variations in the circulation pattern of—for example—air between sensors 10, 11, 12 of the measuring system and the substrate W, for example during movement of the substrate table WT. This can minimize variations in the refractive index in the slit S and improve reproducibility of the various sensors. An other merit is, that the space filling and/or enclosing body 4 can shield of wafer stage compartment fluid from the metro frame 3, which can prevent thermal contamination near the substrate measuring location. Also, a merit is that the space filling and/or enclosing body 4 can provide an interface for mirrors for the reference beams of an interferometer.

Besides, preferably, variations of a temperature distribution of the space filling and/or enclosing body 4, its light passages and/or light conductors 4, and its surroundings can be reduced by the present method and apparatus. For example, as follows from the above, to decrease the temperature fluctuations of the space filling and/or enclosing body 4, the body can be a liquid or water conditioned space filling and/or enclosing body 4. It has been found that a water conditioned space filling and/or enclosing body 4 can provide a temperature stabilizing effect of temperature fluctuations in the sensor measuring beams 8, 9, which fluctuations can be due to wafer table movements. Thus, a thermally conditioned space filling and/or enclosing body 4 can improve the performance of the measuring system 10, 11, 12.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the term "comprising" does not exclude other elements or steps. Also, each of the terms "a" and "an" does not exclude a plurality. Also, a single processor or other unit may fulfil functions of several means recited in the claims. Any reference sign(s) in the claims shall not be construed as limiting the scope of the claims.

What is claimed is:

1. A lithographic apparatus comprising:
    a substrate table constructed to hold a substrate, the substrate table being moveable to transfer the substrate between a substrate measuring position and a substrate processing position;
    a measuring system configured to generate at least one measuring beam and/or field to measure at least one aspect and/or characteristic of the substrate when the substrate table holds the substrate in the substrate measuring position;
    and
    a conditioning system configured to supply a conditioning fluid to at least part of a path of the measuring beam and/or at least part of the field of the measuring system to condition the part of the path of the measuring beam and/or the part of the field;
    wherein the conditioning system comprises a fluid flow control surface that is disposed opposite to, and spaced from, the substrate held by the substrate table when the substrate table is in the substrate measuring position, a surface of the substrate receiving the at least one measuring beam and/or being exposed to the field of the measuring system.

2. An apparatus according to claim 1, wherein the conditioning system is configured to direct the conditioning fluid substantially towards the part of the path of the measuring beam and/or the part of the field.

3. An apparatus according to claim 1, wherein the conditioning system is configured to direct the conditioning fluid at least substantially towards and/or along the same part of a surface of a substrate being held in the measuring position, as a surface part receives the at least one measuring beam and/or is exposed to the field of the measuring system.

4. An apparatus according to claim 1, wherein the conditioning system is configured to thermally condition the conditioning fluid.

5. An apparatus according to claim 1, wherein the part of the path of the measuring beam and/or the part of the field extends between the fluid flow control surface and the substrate surface.

6. An apparatus according to claim 1, wherein the fluid flow control surface extends substantially parallel to the substrate surface of a substrate held in the substrate measuring position.

7. An apparatus according to claim 1, wherein the closest distance between the fluid flow control surface and the substrate surface, or the width of the slit between the fluid flow control surface and the substrate surface, is less than about 5 mm.

8. An apparatus according to claim 1, wherein the fluid control surface of the conditioning system comprises at least one fluid outlet to supply conditioning fluid to the slit, provided by the fluid control surface and a substrate surface when a respective substrate is in the measuring position.

9. An apparatus according to claim 8, wherein the at least one fluid outlet is provided with a thin sheet having a plurality of inclined gas passages.

10. An apparatus according to claim 8, wherein the at least one fluid outlet and at least one fluid inlet are located at substantially opposite sides with respect to part of the path of the at least one measuring beam and/or part of the field of the measuring system, to supply conditioning fluid to that part and to remove or extract conditioning fluid from that part.

11. An apparatus according to claim 1, further comprising a space filling and/or space enclosing body having the fluid flow control surface.

12. An apparatus according to claim 11, wherein the space filling and/or enclosing body comprises a system to thermally condition the body.

13. An apparatus according to claim 12, wherein the space filling and/or enclosing body comprises a number of fluid passages to feed a thermally conditioned fluid through the body.

14. An apparatus according to claim 11, wherein the space filling and/or space enclosing body comprises at least one light passage and/or light conductor, to transmit the at least one measuring beam and/or the field of the measuring system through at least part of the body.

15. An apparatus according to claim 14, wherein the at least one light passage and/or light conductor provides a stationary light transmission medium.

16. An apparatus according to claim 1, wherein the conditioning system comprises at least one fluid inlet to remove or extract conditioning fluid.

17. An apparatus according to claim 16, wherein the fluid flow control surface of the conditioning system is provided with the at least one fluid inlet.

18. An apparatus according to claim 1, wherein the conditioning fluid is a gas or a gas mixture.

detecting with at least one measuring beam and/or field at least one aspect, characteristic, position and/or orientation of the substrate being held in the substrate measuring position; and directing a conditioning fluid to at least part of a path of the measuring beam and/or at least part of the field with a conditioning system to condition the part of the path, the conditioning system comprising a fluid flow control surface that is disposed opposite to, and spaced from, the substrate when the substrate is in the substrate measuring position, a surface of the substrate receiving the at least one measuring beam and/or being exposed to the field of the measuring system.

19. An apparatus according to claim 1, wherein the substrate is moveable from the substrate measuring position to the substrate processing position substantially in a single virtual plane or level.

20. An apparatus according to claim 1, wherein the measuring system is configured to measure a position and/or orientation of the substrate with respect to the substrate table.

21. A lithographic apparatus comprising:
a substrate table constructed to hold a substrate, the substrate table being moveable to transfer the substrate at least between a substrate measuring position and a substrate processing position;
a measuring system configured to generate at least one measuring beam and/or field to measure at least one aspect and/or characteristic of the substrate when the substrate table holds the substrate in the substrate measuring position, and
a space filling and/or space enclosing body comprising a fluid flow control surface that extends opposite the substrate measuring position and near the substrate measuring position, the fluid control surface extending substantially parallel to a surface of the substrate held in the substrate measuring position, the space filling and/or space enclosing body being configured to direct a conditioning fluid to at least part of a path of the measuring beam and/or at least part of the field of the measuring system, the part of the path of the measuring beam and/or the part of the field extending between the fluid flow control surface and the substrate surface.

22. A method comprising:
holding a substrate in a substrate measuring position;
detecting with at least one measuring beam and or field at least one aspect, characteristic, position and/or orientation of the substrate being held in the substrate measuring position; and
directing a conditioning fluid to at least part of a path of the measuring beam and/or at least part of the field with a conditioning system to condition the part of the path, the conditioning system comprising a fluid flow control surface that is disposed opposite to, and spaced from, the substrate when the substrate is in the substrate measuring position, a surface of the substrate receiving the at least one measuring beam and/or being exposed to the field of the measuring system.

23. A method according to claim 22, further comprising projecting a patterned beam of radiation onto the substrate when the substrate is held in a processing position, wherein at least one result of the detection of at least one aspect, characteristic, position and/or orientation of the substrate is used to project the patterned beam of radiation onto the substrate.

24. A method according to claim 22, further comprising projecting a patterned beam of radiation onto the substrate when the substrate is held in the processing position, wherein at least one result of the detection of at least one aspect, characteristic, position and/or orientation of the substrate is used to align the substrate with respect to a projection system before projecting the patterned beam of radiation onto the substrate.

25. A method according to claim 22, further comprising patterning the beam of radiation with a patterning device, wherein at least one result of the detection or measurement of the position and/or orientation of the substrate is used to align the substrate with respect to a support structure constructed to support the patterning device, or with respect to the patterning device.

26. A lithographic apparatus comprising:
a substrate table constructed to hold a substrate, the substrate table being moveable to transfer the substrate between a substrate measuring position and a substrate processing position;
a measuring system configured to generate at least one measuring beam and/or field to measure at least one aspect and/or characteristic of the substrate when the substrate table holds the substrate in the substrate measuring position;
a space filling and/or space enclosing body comprising a fluid flow control surface that extends opposite the substrate measuring position and near the substrate measuring position; and
a system to thermally condition the space filling and/or enclosing body.

27. A lithographic apparatus according to claim 26, wherein the system to thermally condition the space filling and/or enclosing body comprises a plurality of fluid passages constructed and arranged to feed a thermally conditioned fluid through the body.

28. A lithographic apparatus according to claim 27, wherein the thermally conditioned fluid comprises a gas.

29. A lithographic apparatus according to claim 27, wherein the thermally conditioned fluid comprises a liquid.

* * * * *